United States Patent
Gurtovnik (10) Patent No.: US 9,557,382 B1
(45) Date of Patent: Jan. 31, 2017

(54) INTER-BLOCK SCAN TESTING WITH SHARE PADS

(71) Applicant: MARVELL ISRAEL (M.I.S.L) LTD., Yokneam (IL)

(72) Inventor: Alexander Gurtovnik, Modiin (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 20 days.

(21) Appl. No.: 14/138,775

(22) Filed: Dec. 23, 2013

Related U.S. Application Data (60) Provisional application No. 61/747,581, filed on Dec. 31, 2012.

(51) Int. Cl.
*G01R 31/3185* (2006.01)
*G01R 31/3177* (2006.01)

(52) U.S. Cl.
CPC ... *G01R 31/318558* (2013.01); *G01R 31/3177* (2013.01); *G01R 31/318533* (2013.01); *G01R 31/318536* (2013.01); *G01R 31/318544* (2013.01)

(58) Field of Classification Search
CPC .............. G01R 31/318558; G01R 31/318533; G01R 31/318536; G01R 31/318544
See application file for complete search history.

(56) References Cited

U.S. PATENT DOCUMENTS

| | | | |
|---|---|---|---|
| 5,592,493 A * | 1/1997 | Crouch et al. ................ | 714/729 |
| 5,598,421 A * | 1/1997 | Tran et al. .................... | 714/726 |
| 5,841,792 A * | 11/1998 | Kawano et al. ............. | 714/733 |
| 6,378,090 B1 * | 4/2002 | Bhattacharya ................ | 714/724 |
| 6,381,717 B1 * | 4/2002 | Bhattacharya ................ | 714/724 |
| 6,405,335 B1 * | 6/2002 | Whetsel ....................... | 714/726 |
| 6,418,545 B1 * | 7/2002 | Adusumilli ................... | 714/729 |
| 6,425,100 B1 * | 7/2002 | Bhattacharya ................ | 714/724 |
| 6,522,985 B1 * | 2/2003 | Swoboda et al. ............. | 702/117 |
| 6,686,759 B1 * | 2/2004 | Swamy .................... | 324/750.15 |
| 6,769,080 B2 * | 7/2004 | Whetsel ....................... | 714/729 |
| 6,990,619 B1 * | 1/2006 | Kapur et al. ................. | 714/729 |
| 7,428,678 B1 * | 9/2008 | Berndt et al. ................ | 714/729 |
| 7,788,559 B2 * | 8/2010 | Whetsel ....................... | 714/727 |
| 2008/0091995 A1 * | 4/2008 | Baik et al. ................... | 714/726 |
| 2010/0333055 A1 * | 12/2010 | Yu et al. ...................... | 716/108 |
| 2011/0099442 A1 * | 4/2011 | Hales et al. ................. | 714/729 |
| 2011/0307750 A1 * | 12/2011 | Narayanan et al. .......... | 714/729 |

* cited by examiner

*Primary Examiner* — Joseph D Torres (57) ABSTRACT

An integrated circuit (IC) chip includes a first circuit block, a second circuit block, an inter-block circuit and a control circuit. The first circuit block is configured to form a first scan chain to set states of flip-flops in the first circuit block. The second circuit block is configured to form a second scan chain to set states of flip-flops in the second circuit block. The inter-block circuit interfaces the first circuit block and the second circuit block. The control circuit is configured to load a first portion and a second portion of a test pattern separately to the first scan chain and the second scan chain to set states of flip-flops in the first circuit block and the second circuit block, enable a test of the inter-block circuit to capture a test result, and unload the test result from the first scan chain and the second scan chain.

7 Claims, 6 Drawing Sheets

INTER-BLOCK SCAN TESTING WITH SHARE PADS

INCORPORATION BY REFERENCE

This present disclosure claims the benefit of U.S. Provisional Application No. 61/747,581, "INTER-BLOCK SCAN TESTING WITH SHARE PADS" filed on Dec. 31, 2012, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, in a scan test enabled circuit, flip-flops in the circuit are configured to form one or more scan chains in a test mode. The scan chains are then used to shift test patterns in the circuit or shift test results out of the circuit to improve control and observability for testing.

SUMMARY

Aspects of the disclosure provide an integrated circuit (IC) chip. The IC chip includes a first circuit block, a second circuit block, an inter-block circuit and a control circuit. The first circuit block is configured to form a first scan chain in a test mode to set states of flip-flops in the first circuit block. The second circuit block is configured to form a second scan chain in a test mode to set states of flip-flops in the second circuit block. The inter-block circuit interfaces the first circuit block and the second circuit block. The control circuit is configured to load a first portion and a second portion of a test pattern separately to the first scan chain and the second scan chain to set states of flip-flops in both the first circuit block and the second circuit block, enable a test of the inter-block circuit to capture a test result in the flip-flops, and unload the test result from the first scan chain and the second scan chain.

According to an aspect of the disclosure, the IC chip includes a first pad configured to receive a bit stream of the test pattern that combines the first portion and the second portion. The scan control circuit is configured to separate the first portion and the second portion, and provide the first portion to the first circuit block and the second portion to the second circuit block. Further, the IC chip includes a second pad configured to output the test result unloaded from the first scan chain and the second scan chain.

In an embodiment, the control circuit includes a de-multiplexer configured to receive the bit stream and output bits respectively to the first circuit block and the second circuit block based on a selector signal. Further, the control circuit includes a clock control circuit configured to provide clock signals respectively to the first circuit block and the second circuit block based on the selector signal. In an example, the IC chip includes a third pad configured to receive the selector signal from an external source, such as a tester, and provide the selector signal to the de-multiplexer and the clock control circuit. In another example, the control circuit includes a selector circuit configured to generate the selector signal for the de-multiplexer and the clock control circuit.

Aspects of the disclosure provide a method for testing an IC chip. The method includes loading a first portion and a second portion of a test pattern separately to a first scan chain in a first circuit block and a second scan chain in a second circuit block to set states of flip-flops in both the first circuit block and the second circuit block, enabling a test of an inter-block circuit interfacing the first circuit block and the second circuit block to capture a test result in the flip-flops, and unloading the test result from the first scan chain and the second scan chain.

Aspects of the disclosure provide a method of test pattern generation. The method includes determining a fault for detection in an inter-block circuit in a design. The inter-block circuit interfaces a first block and a second block in the design. The first circuit block is configured to form a first scan chain to enable a scan test of the first circuit block, and the second circuit block is configured to form a second scan chain to enable a scan test of the second circuit block. The method further includes generating a test pattern to detect the fault. The test pattern includes a first portion to be loaded to the first scan chain and a second portion to be loaded to the second scan chain.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
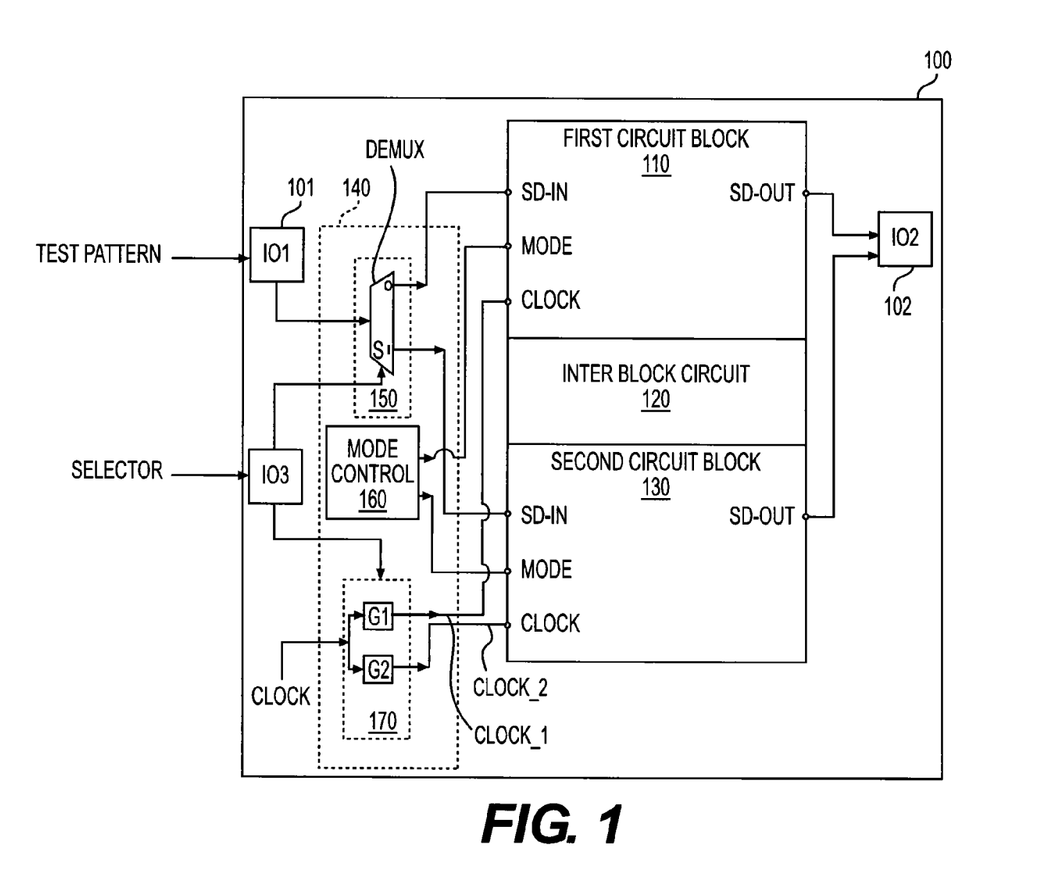
FIG. 1 shows a block diagram of an integrated circuit (IC) chip example 100 according to an embodiment of the disclosure.

FIG. 1 shows a block diagram of an integrated circuit (IC) chip example 100 according to an embodiment of the disclosure. The IC chip 100 includes a plurality of scan test enabled circuit blocks, such as a first circuit block 110, a second circuit block 130, and the like, and inter-block circuits, such as an inter-block circuit 120, interfaces the scan test enabled circuit blocks. Further, the IC circuit 140 includes a control circuit 140 configured to enable a scan test of the inter-block circuits using a reduced number of input/output (I/O) components. These elements are coupled together as shown in FIG. 1.

In the FIG. 1 example, the scan test enabled circuit blocks are configured to perform respective functions. In an example, the first circuit block 110 is a central processing unit (CPU), and the second circuit block 130 is a graphics processing unit (GPU). In another example, the first circuit block 110 and the second circuit block 130 are two functional blocks in a CPU. It is noted that the first circuit block 110 and the second circuit block 130 can be the same functional blocks or can be different functional blocks. In an example, the first circuit block 110 and the second circuit block 130 are designed separately as individual modules, for example, by different design groups or by the same design group. Then, the first circuit block 110 and second circuit block 130 are integrated together by glue logics, such as interface circuits, and the like, that form inter-block circuits, such as the inter-block circuit 120.

According to an aspect of the disclosure, each of the scan test enabled circuit blocks is individually scan-testable. In the FIG. 1 example, the first circuit block 110 includes a plurality of flip-flops (not shown) configured to enable scan test. Specifically, the flip-flops are configured according to a regular operation mode and a test mode. In the regular operation mode, the flip-flops are configured to individually perform regular flip-flop functions; and in the test mode, the flip-flops can be configured to form a scan chain and perform functions of a shift register. In an example, a test includes a loading stage, a capture stage, and an unloading stage. During the loading stage and the unloading stage, the flip-flops are configured in the test mode to form the scan chain and perform functions of a shift register. During the capture stage, the flip-flips are configured in the regular operation mode to individually perform regular flip-flop functions.

In an example, the first circuit block 110 is modularly designed with IO pins, such as a scan-data input pin (SD-IN), a scan-data output pin (SD-OUT), a mode pin and a clock pin. The mode pin is configured to receive a mode control signal, and the mode control signal is provided to the flip-flops. The flip-flops are then configured according to the mode control signal. For example, when the mode control signal is indicative of a regular operation mode, the flip-flops are configured to individually perform regular flip-flop functions; and when the mode control signal is indicative of a test mode (e.g., loading stage and unloading stage), the flip-flops are configured to functionally form a shift register to shift a bit stream sequentially in the shift register. The clock pin is configured to receive a clock signal for the operations in the first circuit block 110, such as for clocking the flip-flops. The scan-data input pin is configured to receive a bit stream of test patterns in the test mode, and provide the bit stream to a first flip-flop of the scan chain in the test mode. The scan-data output pin is configured to receive a bit stream of test results from a last flip-flop of the scan chain in the test mode and output the bit stream, for example, to an IO pad (e.g., IO2) in the test mode.

During a test of the first circuit block 110, the first circuit block 110 receives the mode control signal indicative of the test mode. Then, the flip-flops in the first circuit block 110 form the scan chain. The scan chain operates based on the clock signal to shift a bit stream of a test pattern and the states of the flip-flops are set according to the bit stream. Then, the mode control signal changes to the regular operation mode, the circuits in the first circuit block 110 operate based on the states of the flip-flops for one or more clock cycles of the clock signal, and a test result is captured by the flip-flops. Then, the mode control signal changes to the test mode and the flips-flops form the scan chain again. The scan chain operates based on the clock signal to shift out the captured test result in the form of a bit stream.

It is noted that, in an example, the flip-flops in the first circuit block 110 form multiple scan chains. The multiple scan chains can operate in parallel to respectively receive bit streams of a test pattern from multiple IO pads, and can operate in parallel to respectively output bit streams of a test result to multiple IO pads.

In the FIG. 1 example, the second circuit block 130 is similarly configured as the first circuit block 110 to enable scan test. The description has been provided above and will be omitted here for clarity purposes.

In an embodiment, the first circuit block 110 and the second circuit block 130 are separately scan testable using the shared IO components, such as IO pads IO1 and IO2. In addition, according to an aspect of the disclosure, the IC chip 100 is configured to enable the inter-block circuit 120 to be scan-testable using the shared IO components, such as the IO pads IO1 and IO2. In an embodiment, to perform a scan test of the inter-block circuit 120, the flip-flops in both the first circuit block 110 and the second circuit block 130 are used. In an example, a test pattern for a fault in the inter-block circuit 120 needs to set states of the flip-flops in both the first circuit block 110 and the second circuit block 130 to stimulate the fault. Further, the fault is observable from a test result captured by the flip-flops in both the first circuit block 110 and the second circuit block 130.

In the FIG. 1 example, the control circuit 140 is configured to enable using the flip-flops in both the first circuit block 110 and the second circuit block 130 to test the inter-block circuit 120. Specifically, the control circuit 140 includes a scan data control circuit 150, a mode control circuit 160 and a clock control circuit 170 coupled together as shown in FIG. 1.

The scan data control circuit 150 is configured to receive a bit stream corresponding to a test pattern to test the inter-block circuit 120 from an IO pad, such as IO1. The bit stream includes a first portion to set the states of the flip-flops in the first circuit block 110, and a second portion to set the states of the flip-flops in the second circuit block 130. The first portion and the second portion are suitably combined to form the bit stream. In an example, the second portion follows the first portion in the bit stream. In another example, the first portion and the second portion are interleaved bit-by-bit in the bit stream. The scan data control circuit 150 is configured to partition the bit stream into the first portion and the second portion, provide the first portion to the scan-data input pin of the first circuit block 110 and provide the second portion to the scan-data input pin of the second circuit block 130.

Specifically, in the FIG. 1 example, the scan data control circuit 150 includes a de-multiplexer (DEMUX) configured to receive the bit stream from the IO1, and selectively provide the bit stream to the scan-data input pin of the first circuit block 110 and the scan-data input pin of the second circuit block 130 based on a selector signal. In the FIG. 1 example, the selector signal is received from an external source, such as a tester, and the like, via an IO component, such as IO pad IO3. It is noted that the selector signal can be generated by on-chip circuits.

The mode control circuit 160 is configured, in an embodiment, to provide suitable mode control signals to the first circuit block 110 and the second circuit block 130. In an example, during a time to load a test pattern into the flip-flops in the first circuit block 110 and the second circuit block 130, the mode control circuit 160 provides a first mode control signal indicative of the test mode to the first circuit block 110 and a second mode control signal indicative of the test mode to the second circuit block 130. After the test pattern has been loaded, the mode control circuit 160 changes the first mode control signal and the second mode control signal to the regular operation mode to test the inter-block circuit 120 according to the test pattern, and capture a test result. When the test result has been captured, the mode control circuit 160 changes the first mode control signal and the second mode control signal to the test mode to unload the test result.

The clock control circuit 170 is configured to provide suitable clock signals to first circuit block 110 and the second circuit block 130. In an example, the clock control circuit 170 is configured to provide a first clock signal (CLOCK_1) to the first circuit block 110 and a second clock signal (CLOCK_2) to the second circuit block 130 based on a system clock (CLOCK). In an example, the first clock signal and the second clock signal are suitably gated from the system clock. For example, at the time to load the first portion of the bit stream into the first circuit block 110, clocking transitions are enabled in the first clock signal, and clocking transitions are disabled in the second clock signal; at the time to load the second portion of the bit stream into the second circuit block 130, clocking transitions are disabled in the first clock signal, and clocking transitions are enabled in the second clock signal; at the time to test the inter-block circuit 120 with the loaded test pattern and to capture the test result, clocking transitions in both the first clock signal and the second clock signal are enabled; at the time to unload a first portion of the test result from the first circuit block 110, clocking transitions are enabled in the first clock signal, and clocking transitions are disabled in the second clock signal; and at the time to unload a second portion of the test result from the second circuit block 130, clocking transitions are disabled in the first clock signal, and clocking transitions are enabled in the second clock signal.

Specifically, in the FIG. 1 example, the clock control circuit 150 includes a first clock gating circuit (G1) and a second clock gating circuit (G2). The first clock gating circuit is configured to receive the system clock, pass or block clocking transitions in the system clock based on suitable signals (e.g., the selector signal received from the IO pad IO3, the first mode control signal, and etc.) to generate the first clock signal, and provide the first clock signal to the clock pin of the first circuit block 110. The second clock gating circuit is configured to receive the system clock, pass or block clocking transitions in the system clock based on suitable signals (e.g., the selector signal received from the IO pad IO3, the second mode control signal, and etc.) to generate the second clock signal and provide the second clock signal to the clock pin of the second circuit block 130.

It is noted that, in the FIG. 1 example, the bit stream of the test pattern can combine the first portion and the second portion in any suitable manner. The selector signal (SELECTOR) is generated externally to correspond to the manner in which the first portion and the second portion are combined. When the scan-data control circuit 150 receives the bit stream and the selector signal, the scan-data control circuit 150 partitions the bit stream according to the selector signal.

Figure 2:
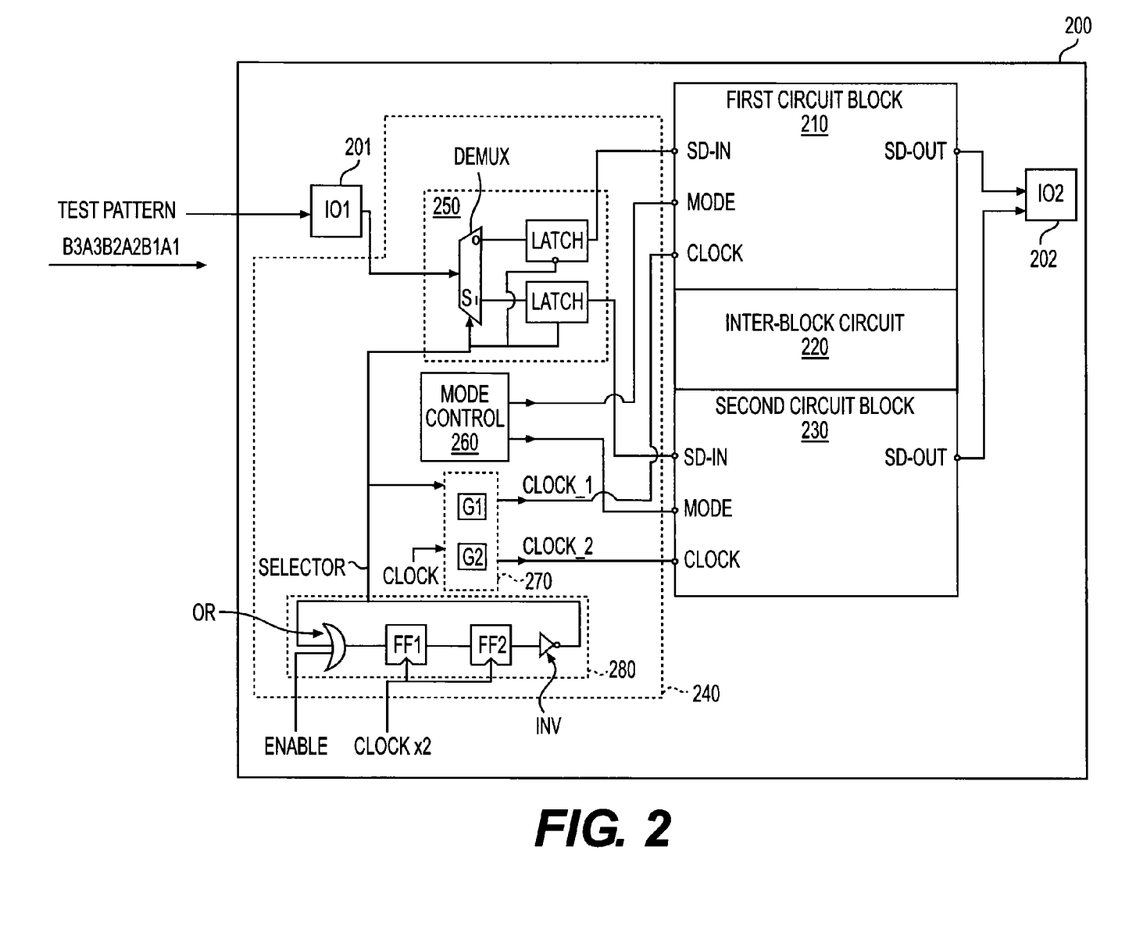
FIG. 2 shows a block diagram of another IC chip example 200 according to an embodiment of the disclosure.

FIG. 2 shows a block diagram of another IC chip 200 according to an embodiment of the disclosure. The IC chip 200 utilizes certain components that are identical or equivalent to those used in the IC chip 100; the description of these components has been provided above and will be omitted here for clarity purposes.

In the FIG. 2 example, the test pattern interleaves the first portion and the second portion bit-by-bit into the bit stream, and the selector signal (SELECTOR) is generated on-chip to partition the bit stream. Specifically, the control circuit 240 includes a selector generation circuit 280 configured to generate the selector signal that interleaves a first value and a second value, such as a logic "1" and a logic "0". For example, in a first clock cycle of the system clock (e.g., CLOCK), the selector signal is logic "1" and in a next clock cycle, the selector signal is logic "0".

The selector signal can be generated by any suitable on-chip circuit. In the FIG. 2 example, the selector generation circuit 280 includes an or gate (OR), two flip-flops (FF1 and FF2), and an inverter (INV) coupled together as shown in FIG. 2. The flip-flops FF1 and FF2 are clocked by a clock signal that doubles the frequency of the system clock (CLOCK). The selector generation circuit 280 is enabled/disabled based on an enable signal (ENABLE). In an example, when the enable signal is logic "1", the selector generation circuit 280 generates the selector signal having a fixed value, such as logic "0"; and when the enable signal is logic "0", the selector generation circuit 280 generates the selector signal having alternative logic "1" and logic "0".

Figure 3:
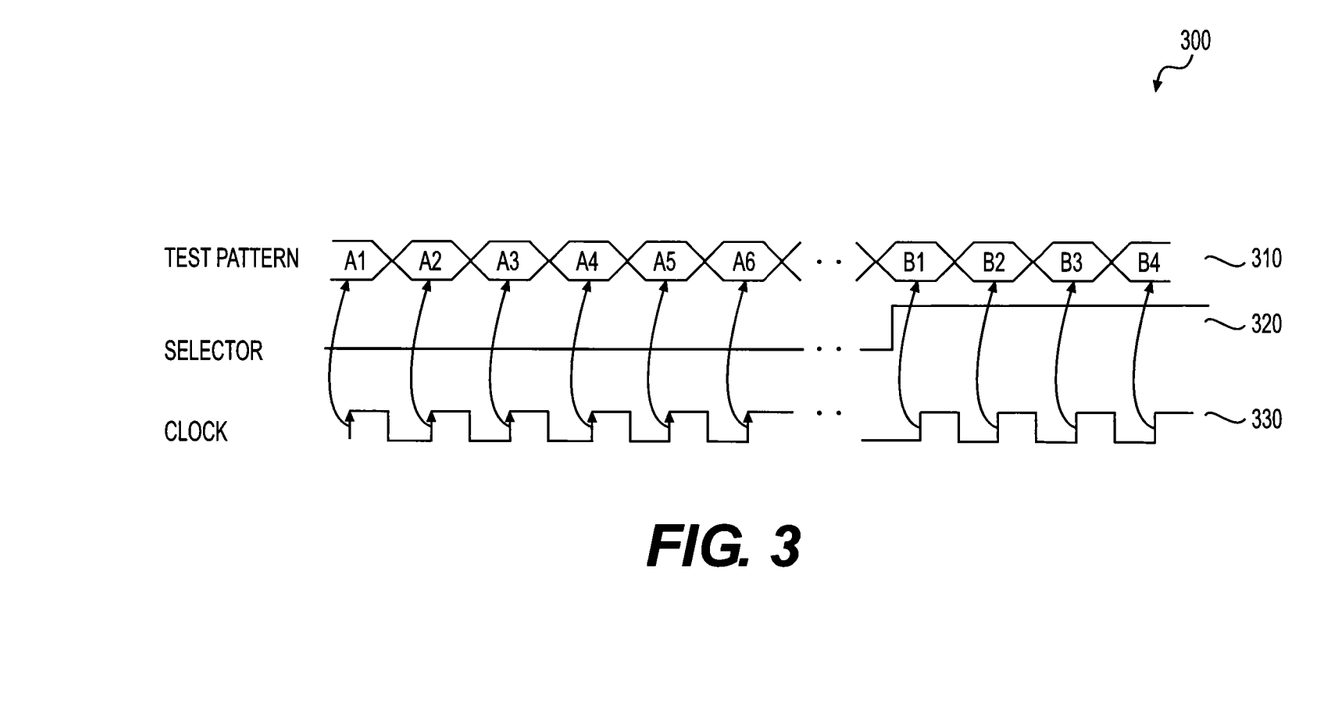
FIG. 3 shows a plot of waveforms for testing the IC chip 100 according to an embodiment of the disclosure.

FIG. 3 shows a plot 300 of waveforms for testing the IC chip 100 according to an embodiment of the disclosure. The plot 300 includes a first waveform 310 for the test pattern, a second waveform 320 for the selector signal, and a third waveform 330 for the system clock (CLOCK).

The test pattern includes a first portion, such as (A1)(A2)(A3) . . . , for setting the flip-flops in the first circuit clock 110, and a second portion, such as (B1)(B2)(B3) . . . , for setting the flip-flops in the second circuit block 130. The selector signal matches the manner in which the test pattern combines the first portion and the second portion. In the FIG. 3 example, the entire second portion follows the entire first portion in the test pattern. The selector signal has logic "0" corresponding to the first portion in the test pattern, and has logic "1" corresponding to the second portion in the test pattern.

In an example, during a testing of the IC chip 100, the IC chip 100 receives the test pattern and the corresponding selector signal. Based on the selector signal, the first portion is provided to the scan-data input pin of the first circuit block 110, and the second portion is provided to the scan-data input in of the second circuit block 130. Further based on the selector signal, the first clock signal CLOCK_1 is generated and provided to the first circuit block 110, and the second clock signal CLOCK_2 is generated and provided to the second circuit block 130. In an example, when the selector signal is logic "0", the first clock signal CLOCK_1 follows the system clock CLOCK, and the second clock signal CLOCK_2 has a fixed value; and when the selector signal is logic "1", the first clock signal CLOCK_1 has a fixed value and the second clock signal CLOCK_2 follows the system clock CLOCK. Thus, the first portion is shifted into the flip-flops of the first circuit block 110 and the second portion is shifted into the flip-flops of the second circuit block 130.

Figure 4:
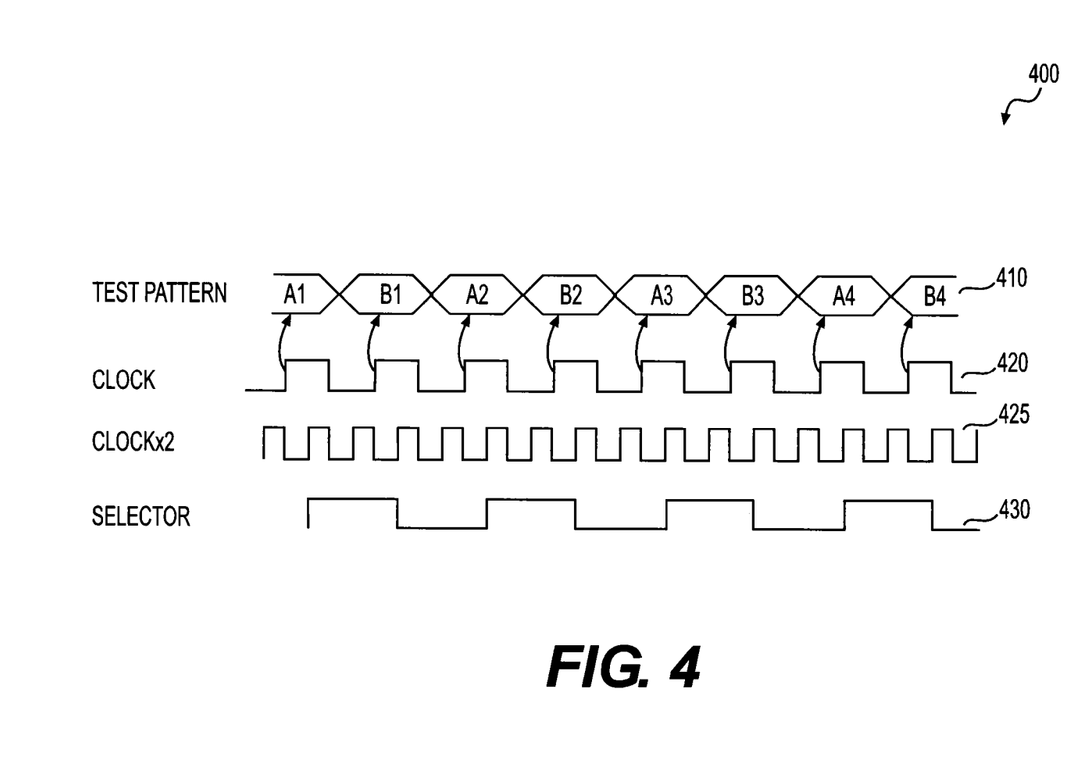
FIG. 4 shows a plot of waveforms for testing the IC chip 200 according to an embodiment of the disclosure.

FIG. 4 shows a plot 400 of waveforms for testing the IC chip 200 according to an embodiment of the disclosure. The plot 400 includes a first waveform 410 for the test pattern, a second waveform 420 for the system clock (CLOCK), a third waveform 425 for a high frequency signal (CLOCKx2) that doubles the frequency of the system clock, and a fourth waveform 430 for the selector signal.

The test pattern includes a first portion, such as (A1)(A2)(A3) . . . , for setting the flip-flops in the first circuit clock 110, and a second portion, such as (B1)(B2)(B3) . . . , for setting the flip-flops in the second circuit block 130. The first portion and the second portion are interleaved bit-by-bit to form the bit stream of the test pattern.

The selector signal is generated on the IC chip 200, such as by the selector generation circuit 280. The selector signal alternates logic "0" and logic "1" cycle by cycle of the system clock.

In an example, during a testing of the IC chip 200, the IC chip 200 receives the test pattern and generates the selector signal on-chip. Based on the selector signal, the first portion is provided to the scan-data input pin of the first circuit block 210, and the second portion is provided to the scan-data input pin of the second circuit block 230. Further based on the selector signal, the first clock signal CLOCK_1 and the second clock signal CLOCK_2 are generated. In an example, when the selector signal is logic "0", the first clock signal CLOCK_1 follows the system clock CLOCK, and the second clock signal CLOCK_2 has a fixed value; and when the selector signal is logic "1", the first clock signal CLOCK_1 has a fixed value and the second clock signal CLOCK_2 follows the system clock CLOCK. Thus, the first portion is shifted into the flip-flops of the first circuit block 210 and the second portion is shifted into the flip-flops of the second circuit block 230.

It is noted that, according to an aspect of the disclosure, the first clock signal CLOCK_1 and the second clock signal CLOCK_2 are separately generated based on the selector signal during the loading and unloading stages. Further, in the capture stage that is between the loading stage and the unloading stage, both the first and second clock signals CLOCK_1 and CLOCK_2 are enabled and follow the system clock CLOCK to test the inter-block circuit 220 and capture the results. It is also noted that, according to the aspect of the disclosure, both the first and second clock signals CLOCK_1 and CLOCK_2 are enabled and follow the system clock CLOCK during the regular operation mode.

Figure 5:
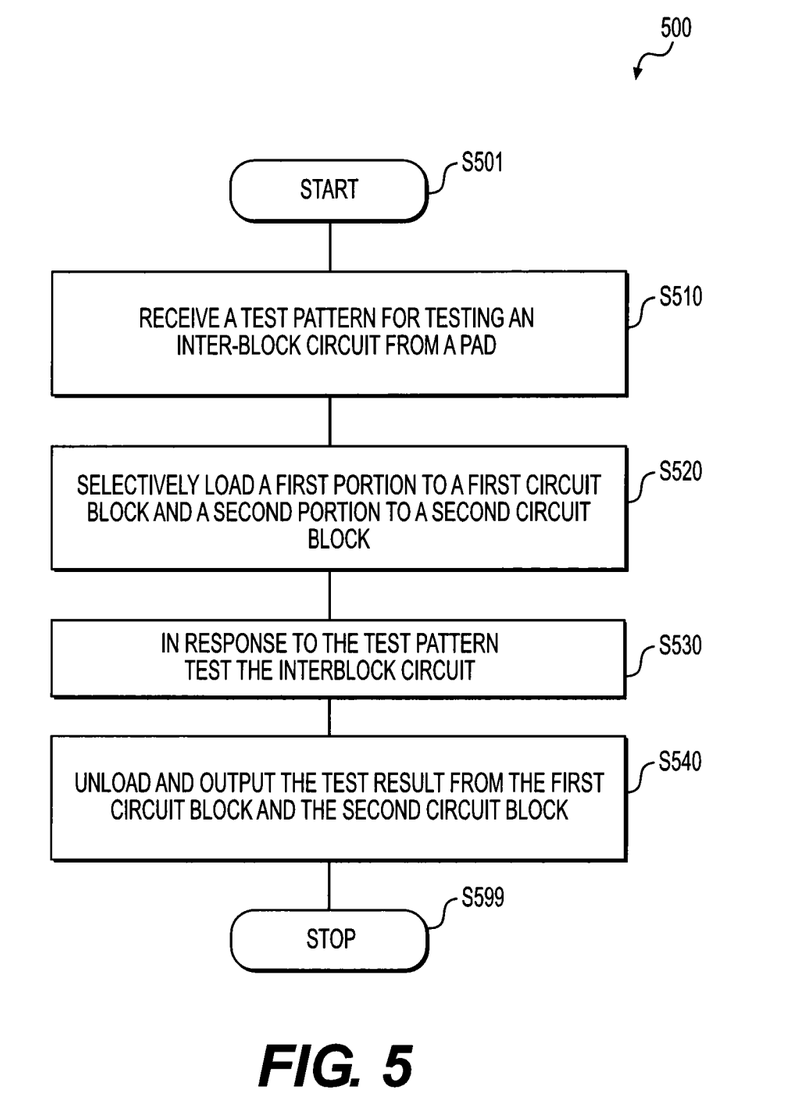
FIG. 5 shows a flow chart outlining a testing process example 500 according to an embodiment of the disclosure.

FIG. 5 shows a flow chart outlining a process 500 for testing an inter-block circuit, such as the inter-block circuit 120, the inter-block circuit 220, and the like according to an embodiment of the disclosure. The process starts at S501 and proceeds to S510.

At S510, a test pattern for testing an inter-block circuit is received by an IC chip under test from a pad. In the FIG. 1 example, the inter-block circuit 120 includes glue logics that integrate the first circuit block 110 and the second circuit block 130. The first circuit block 110 and the second circuit block 130 are respectively scan-testable, and can be individually tested using IO pads IO1 and IO2 in an example. To test the inter-block circuit 120, flip-flops in both the first circuit block 110 and the second circuit block 130 are used. The test pattern includes a first portion to set the states of the flip-flops in the first circuit block 110, and a second portion to set the states of the flip-flops in the second circuit block 130. The first portion and the second portion are suitably combined to form the test pattern. The test pattern can be partitioned into the first portion and the second portion based on a selector signal that matches the manner in which the first portion and the second portion are combined. In the FIG. 1 example, the selector signal is received from an external source. In the FIG. 2 example, the selector signal is generated on-chip.

At S520, the first portion and the second portion are selectively loaded into the first circuit block and the second circuit block. In the FIG. 1 example, the mode control circuit 160 generates the mode control signals to control the first circuit block 110 and the second circuit block 130 to enter the test mode, thus the flip-flops in the first circuit block 110 form a scan chain, and the flip-flops in the second circuit block 130 form another scan chain. Then, based on the received selector signal, the first portion of the test pattern is shifted into the flip-flops in the first circuit block 110, and the second portion of the test pattern is shifted into the flip-flops in the second circuit block 130.

Similarly, in the FIG. 2 example, the mode control circuit 260 generates the mode control signals to control the first circuit block 210 and the second circuit block 230 to enter the test mode, thus the flip-flops in the first circuit block 210 form a scan chain, and the flip-flops in the second circuit block 230 form another scan chain. Then, based on the selector signal generated on chip, the first portion of the test pattern is shifted into the flip-flops in the first circuit block 210, and the second portion of the test pattern is shifted into the flip-flops in the second circuit block 230.

At S530, the inter-block circuit is tested in response to the test pattern. In the FIG. 1 example, the mode control circuit 160 suitably changes the first circuit block 110 and the second circuit block 130 to the regular operation mode, and both the first clock signal and the second clock signal follow the system clock in the regular operation mode. The inter-block circuit 120 operates based on the test pattern, and the test result is captured by the flip-flops in both the first circuit block 110 and the second circuit block 130.

Similarly, in the FIG. 2 example, the mode control circuit 260 suitably changes the first circuit block 210 and the second circuit block 230 to the regular operation mode, and both the first clock signal and the second clock signal follow the system clock in the regular operation mode. The inter-block circuit 220 operates based on the test pattern, and the test result is captured by the flip-flops in both the first circuit block 210 and the second circuit block 230.

At S540, the test result from the first circuit block and the second circuit block is unloaded and output of the IC chip. In the FIG. 1 example, the mode control circuit 160 changes the first circuit block 110 and the second circuit block 130 to the test mode. Further, in an example, the clock control circuit 170 allows clocking in the first clock signal and the blocks clocking in the second clock signal to unload a first portion of the test result from the flip-flops in the first circuit block 110. The first portion is output of the IC chip 100 from the IO pad IO2. Then the clock control circuit 170 allows clocking in the second clock signal and blocks clocking in the first clock signal to unload a second portion of the test result from the flip-flops in the second circuit block 130. The second portion is output of the IC chip 100 from the IO pad IO2. The unloading and outputting steps can be similarly performed in the FIG. 2 example. Then the process proceeds to 5599 and terminates.

According to an aspect of the disclosure, the test patterns to test an inter-block circuit interfacing a first circuit block and a second circuit block in an IC chip using shared IO components are generated using an existing automatic test pattern generation (ATPG) program. In an embodiment, for the purpose of the test pattern generation, the design of the IC chip is suitably modified to add IO components and connections to the added IO components, such that the first circuit block and the second circuit block have dedicated IO components. Then the existing ATPG program is used to generate intermediate test patterns that use dedicated IO components for respectively loading and unloading test patterns for the first circuit block and the second circuit block in order to test the inter-block circuit. The intermediate test patterns are then post-processed to generate test patterns that use shared IO components for testing the inter-block circuit. In an embodiment, the added IO components are only for the purpose of test pattern generation, and do not exist in the design corresponding to the IC chip, and are referred to as virtual IO components, such as virtual pads.

Figure 6:
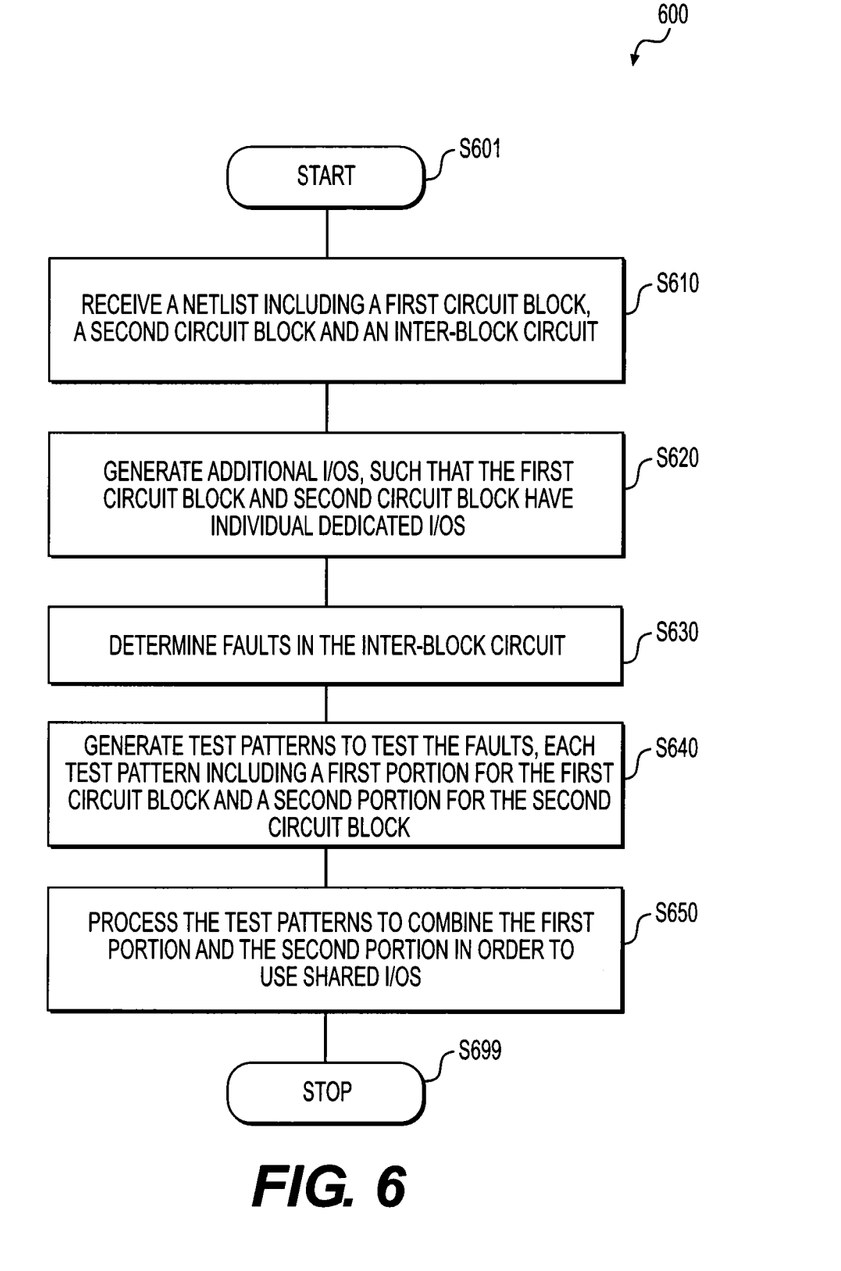
FIG. 6 shows a flow chart outlining a test pattern generation process example 600 according to an embodiment of the disclosure.

FIG. 6 shows a flow chart outlining a test pattern generation process example 600 according to an embodiment of the disclosure. In an embodiment, the test pattern generation process 600 is implemented as software instructions stored in a storage medium. The software instructions are executed by one or more processors to perform the test pattern generation process. The process starts at S601, and proceeds to S610.

At S610, a netlist is received. The netlist is a circuit design, such as a gate level design, of an IC chip, such as the IC chip 100, the IC chip 200, and the like. In an example, the netlist includes a first module corresponding to design of a first circuit block, a second module corresponding to design of a second circuit block, and a third module corresponding to design of an inter-block circuit that interfaces the first circuit block with the second circuit block. In an example, the first module and the second module can be designed by different groups of designers or a same group of designers. In an embodiment, the first module and the second module are respectively designed to be intra-block scan testable. In addition, the first module and the second module are integrated such that the first circuit block and the second circuit are tested using shared IOs.

At S620, additional IOs are generated, such that the first circuit block and the second circuit block have individual dedicated IOs. In an example, the original netlist is modified to generate a modified netlist. Specifically, in an example, the shared IO pads are disconnected from the second module and are dedicated for the first module, and the additional IO pads, such as virtual IO pads, are added and dedicated for the second module.

At S630, faults in the inter-block circuit are determined. In an example, a fault list is previously generated for the netlist. The fault list is modified to keep faults in the inter block circuit, and remove faults in other parts. In an embodiment, the modified fault list can include stuck-at faults and at speed faults in the inter-block circuit.

At S640, test patterns are generated according to the modified netlist to test the faults in the modified fault list. According to an aspect of the disclosure, the first module and the second module have dedicated IOs in the modified netlist, and thus an existing automatic test pattern generation (ATPG) program can be used to generate the test patterns to test the faults. The existing ATPG program takes the modified netlist, and the modified fault list, and generates the test patterns. In an example, each test pattern for testing a fault in the inter-block circuit includes two bit streams that can be respectively input to the first circuit block and the second circuit block to set flip-flop states of the first circuit block and flip-flop states of the second circuit block for testing the fault.

At S650, the test patterns are post-processed to combine the two bit streams into a single bit stream for each test pattern. The two bit streams can be combined in any suitable manner. In an example, one bit stream follows the other bit stream in the combined single bit stream. In another example, the two bit streams are interleaved bit-by-bit to form the single bit stream. In an embodiment, a pattern of the selector signal associated with the post-processed test patterns is generated according to the manner in which the two bit streams are combined. Then, the process proceeds to S699 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An integrated circuit (IC) chip, comprising:
   a first circuit block configured to form a first scan chain in a test mode to set states of flip-flops in the first circuit block;
   a second circuit block, separate from the first circuit block, configured to form a second scan chain in a test mode to set states of flip-flops in the second circuit block;
   an inter-block circuit having logic circuits that interface the first circuit block and the second circuit block; and
   a control circuit configured to load a first portion and a second portion of a test pattern for the inter-block circuit separately to the first scan chain and the second scan chain to set states of flip-flops in both the first circuit block and the second circuit block, enable a test of the inter-block circuit to capture a test result of the inter-block circuit in the flip-flops of the first circuit block and the second circuit block, and unload the test result of the inter-block circuit from the first scan chain and the second scan chain.

2. The IC chip of claim 1, comprising:
   a first pad that is configured to receive a bit stream of the test pattern that combines the first portion and the second portion; and wherein
   the control circuit is configured to separate the first portion and the second portion, and provide the first portion to the first circuit block and the second portion to the second circuit block.

3. The IC chip of claim 2, further comprising:
   a second pad that is configured to output the test result unloaded from the first scan chain and the second scan chain.

4. The IC chip of claim 2, wherein the control circuit comprises:
   a de-multiplexer configured to receive the bit stream and output bits respectively to the first circuit block and to the second circuit block based on a selector signal.

5. The IC chip of claim 4, wherein the control circuit comprises:
   a clock control circuit configured to provide clock signals respectively to the first circuit block and to the second circuit block based on the selector signal.

6. The IC chip of claim 5, further comprising:
   a third pad that is configured to receive the selector signal from an external source, and to provide the selector signal to the de-multiplexer and the clock control circuit.

7. The IC chip of claim 5, comprising:
   a selector circuit that is configured to generate the selector signal for the de-multiplexer and the clock control circuit.

* * * * *